(12) United States Patent
Inoue

(10) Patent No.: US 6,828,604 B2
(45) Date of Patent: Dec. 7, 2004

(54) SEMICONDUCTOR DEVICE WITH ANTENNA PATTERN FOR REDUCING PLASMA DAMAGE

(75) Inventor: Yushi Inoue, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 41 days.

(21) Appl. No.: 10/136,343

(22) Filed: May 2, 2002

(65) Prior Publication Data

US 2002/0192886 A1 Dec. 19, 2002

(30) Foreign Application Priority Data

May 8, 2001 (JP) ........................................ 2001-137475
Jul. 20, 2001 (JP) ........................................ 2001-196436

(51) Int. Cl.[7] .............................................. H01L 27/10
(52) U.S. Cl. ........................ 257/202; 438/128; 438/587
(58) Field of Search ........................ 257/202, E21.143, 257/E21.212, E21.218, E21.311; 438/197, 729, 9, 466, 474, 475, 485, 513, 710, 788, 792, 798, 569

(56) References Cited

U.S. PATENT DOCUMENTS 5,779,925 A * 7/1998 Hashimoto et al. ........... 216/67

FOREIGN PATENT DOCUMENTS

| JP | 11-040564 | 2/1999 |
| TW | 430864 | 4/2001 |

* cited by examiner

Primary Examiner—Minhloan Tran
Assistant Examiner—Scott R Wilson
(74) Attorney, Agent, or Firm—Nixon & Vanderhye P.C.

(57) ABSTRACT

A semiconductor device comprising: a MOS transistor having a gate electrode formed on a semiconductor substrate, a wiring connected to the gate electrode via a first insulating film, an antenna pattern for reducing plasma damage in the form of lines/spaces connected to the wiring, and a second insulating film formed on the wiring and the antenna pattern.

7 Claims, 8 Drawing Sheets

Antenna Ratio=
104.12

Antenna Ratio=
343.76

Antenna Ratio=
1002.87

Antenna Ratio=
3311.5

Antenna Ratio=
2732.7

Antenna Ratio=
23741.01

Fig. 6(a) *(Prior Art)*
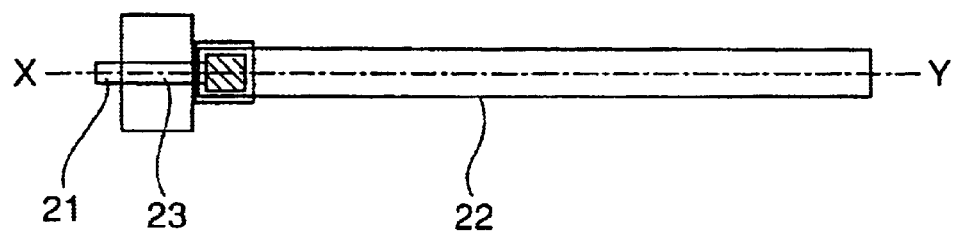
Fig. 6(b) *(Prior Art)*
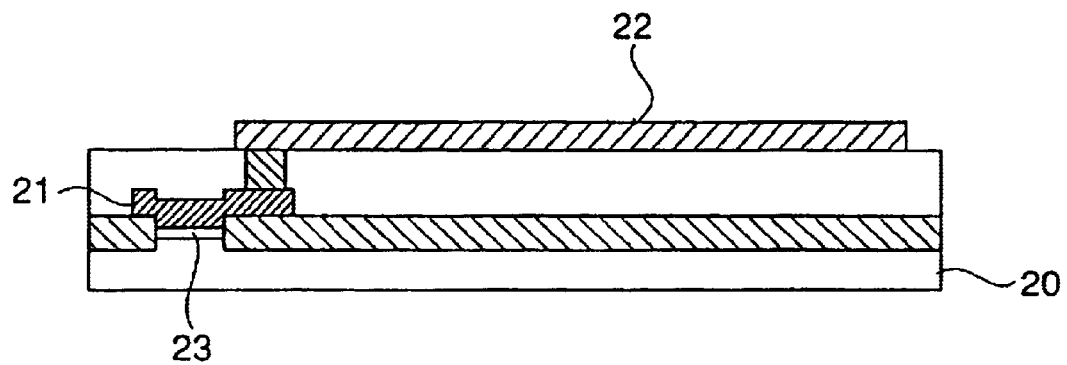

Fig. 7 *(Prior Art)*
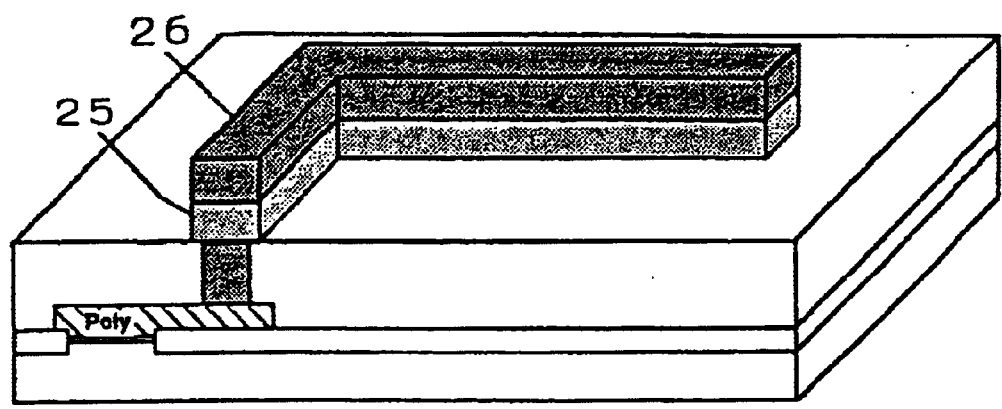

Fig. 8(a) *(Prior Art)*
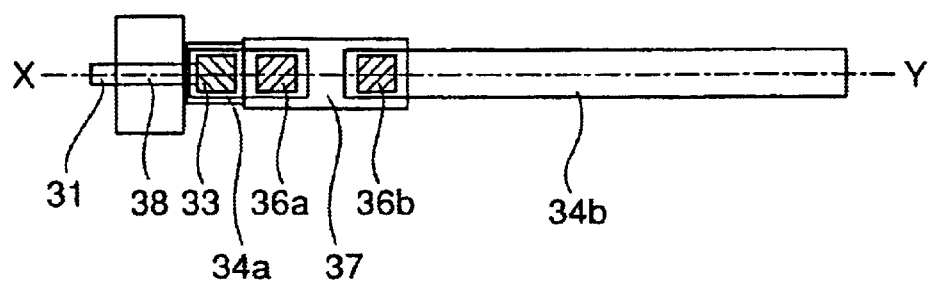
Fig. 8(b) *(Prior Art)*
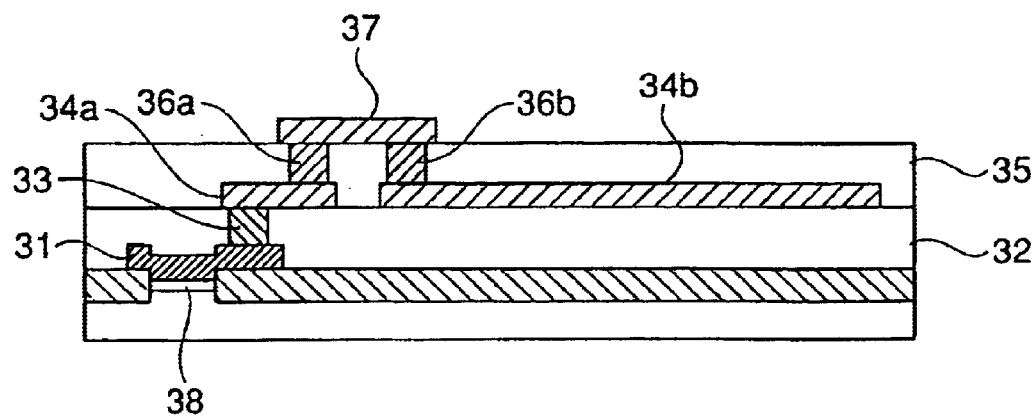

SEMICONDUCTOR DEVICE WITH ANTENNA PATTERN FOR REDUCING PLASMA DAMAGE

CROSS-REFERENCE TO RELATED APPLICATION

This application is related to Japanese application No. 2001-137475 filed on May 8, 2001, whose priority is claimed under 35 USC § 119, the disclosure of which is incorporated by reference in its entirety.

BACKGROUND OF THE INVENTION

1. Field of the Invention

The present invention relates to a semiconductor device and a manufacturing method thereof, and more particularly to a semiconductor device whose gate oxide film is less damaged by a plasma charge during formation of an interlayer dielectric film in processes for manufacturing a semiconductor, and a method for manufacturing the semiconductor device.

2. Description of Related Art

Among the processes for manufacturing a semiconductor, there are many in which plasma is used.

FIGS. 6 (a) and (b) illustrates a gate electrode 21 of a transistor and a wiring 22 connected thereto which constitute a typical semiconductor device. In manufacture of such a semiconductor device, there are many processes in which a plasma is used at the stages of forming the wiring 22 and thereafter. As those processes, there may be mentioned processes using a plasma-etching for patterning the wiring 22, plasma-ashing for removing a resist film, a plasma CVD method for forming an interlayer dielectric film, a plasma-etching for forming a via hole in the interlayer dielectric film and the like.

In plasma, there are ions and electrons produced by ionization. If a semiconductor substrate 20 shown in FIGS. 6(a) and (b) is exposed to a plasma in which a balance in ions and electrons between positive and negative charges is destroyed, electrons enter from a surface of the wiring 22 exposed to the plasma, and flow into the semiconductor substrate 20 via the gate electrode 21 and a gate oxide film 23.

Then, if a large amount of current flows in the resulting transistor or the like, damage is caused to the gate oxide film 23, leading to dielectric breakdown, reduction in long-term reliability or the like. Also, yield in LSIs is lowered. Such damage, which is referred to as plasma damage because it is electrical damage caused by a plasma, is becoming an increasingly severe problem since it causes a significant deterioration or the like as a device is more miniaturized and the thickness of a gate oxide film is more reduced.

Typically, a wiring formed of a conductive film such as a metal film and exposed to a plasma serves an antenna. Conventionally, the antenna is often discussed in terms of the areas of side walls of a wiring 25, because the plasma damage is outstanding mainly in an etching process in which the wiring 25 is covered with a resist film 26. However, recently, a high density plasma (HDP) CVD method is used for formation of an interlayer dielectric film positioning between wirings, and it becomes necessary to define an entire surface area of the wiring as an antenna.

A ratio of the entire surface area of the wiring connected to a gate electrode to the surface area of the gate oxide film is defined as "antenna ratio" to be used as quantitative index of a degree of the plasma damage. Accordingly, if a wiring is of a large pattern like pad, the antenna ratio is generally great which results in a serious plasma damage to the gate insulating film or the like.

A measure against the plasma damage is proposed in, for example, Japanese Unexamined Patent Publication No. Hei 11(1999)-40564.

A semiconductor device described therein is constructed as follows. A first wiring 34a is formed above a gate electrode 31 with a contact 33 interposed therebetween. The contact 33 is formed in an interlayer dielectric film 32. Further, there is formed another first wiring 34b which is not connected to the gate electrode 31. Also, a second wiring 37 is formed above the first wirings 34a and 34b via contacts 36a and 36b interposed between the second wiring 37 and the first wiring 34a and between the second wiring 37 and the other first wiring 34b, respectively, as shown in FIGS. 8 (a) and (b). The via contacts 36a and 36b are formed in an interlayer dielectric film 35.

In the semiconductor device shown in FIGS. 8(a) and (b), because only the first wiring 34a which is connected to the gate electrode 31 serves as an antenna, the antenna ratio can be small. Accordingly, even if the other first wiring 34b is of a large pattern such as a bonding pad, the plasma damage to the gate oxide film 38 is minimized.

However, in the semiconductor device shown in FIGS. 8(a) and (b), because an additional wiring layer is provided, throughput is lowered and cost is increased. Further, yield may possibly be reduced by an increase in the number of processes.

SUMMARY OF THE INVENTION

The present invention has been made in view of the above circumstances and an object thereof is to provide a semiconductor device in which the plasma damage is reduced only by a change of the configuration of a wiring and without an increase in the number of masking processes or wiring-formation processes, and a method for manufacturing the semiconductor.

The present invention provides a semiconductor device comprising: a MOS transistor having a gate electrode formed on a semiconductor substrate, a wiring connected to the gate electrode via a first insulating film, an antenna pattern for reducing a plasma damage in the form of lines/spaces connected to the wiring, and a second insulating film formed on the wiring and the antenna pattern.

Also, the present invention provides a method for manufacturing a semiconductor device comprising the steps of: forming a MOS transistor on a semiconductor substrate, forming a wiring and an antenna pattern for reducing a plasma damage in the form of lines/spaces connected to a gate electrode constituting the MOS transistor via a first insulating film on the MOS transistor, and forming a second insulating film on the wiring and the antenna pattern by a CVD method while applying bias voltage to the semiconductor substrate.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIGS. 6(a) and (b) are plan and cross-sectional views, respectively, of a conventional semiconductor device;

FIG. 7 is a view for explaining antenna rule;

FIGS. 8(a) and (b) are plan and cross-sectional views, respectively, of another conventional semiconductor device.

DESCRIPTION OF THE PREFERRED EMBODIMENTS

Figure 1A:
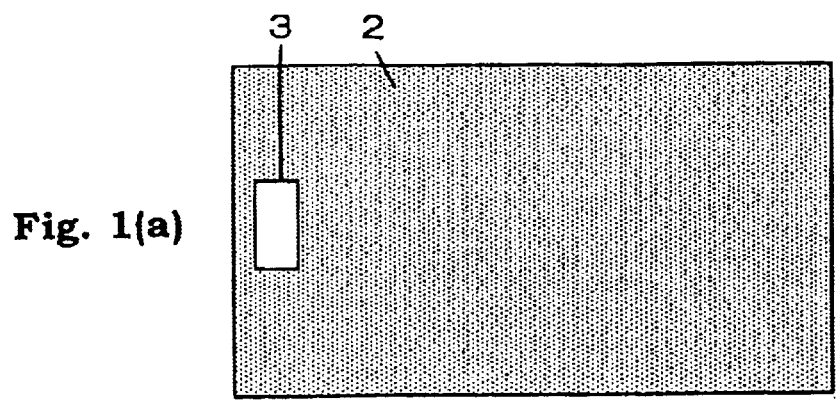
FIGS. 1 (a) to (d) are schematic plan views of an essential part for showing processes of a method for manufacturing a semiconductor device in accordance with the present invention.

A semiconductor device in accordance with the present invention includes at least a MOS transistor formed on a semiconductor substrate, a first insulating film, a wiring together with an antenna pattern of lines/spaces and a second insulating film.

The semiconductor substrate usable in the semiconductor device of the present invention may be a substrate of an elementary semiconductor such as silicon or germanium, a substrate of a compound semiconductor such as GaAs, or a SOS type, SOI type, or multiple-layered SOI type substrate in which a top semiconductor layer is formed of one of the above-mentioned semiconductors. Among them, a silicon substrate is preferable. On a surface of the semiconductor substrate, a device isolation film may be formed by a LOCOS method, a trench device isolation method, a STI technique or the like, and a p-type or n-type impurity diffusion layer (well) may be formed. The MOS transistor may be any of n-type, p-type, and complementary MOS transistors. The MOS transistor typically includes a gate oxide film, a gate electrode and source/drain regions, and optionally LDD region(s), DDD region(s) or the like. Further, there may be formed sidewall spacer(s) on side wall(s) of the MOS.

The first insulating film is typically a film serving as an interlayer dielectric film. The first insulating film may be a single-layer film such as a silicon oxide film (a thermal oxide film, a low temperature oxide film: LTO film or the like, or a high temperature oxide film: HTO film), a silicon nitride film, an SOG film, a PSG film, a BPSG film or the like, or a laminated film of two or more of these films. These films can be formed by an atmospheric CVD method, a reduced pressure CVD method, a plasma CVD method, an HDP plasma CVD method, a sputtering method or the like. The film thickness is not specifically limited, but may be about 300 to 2000 nm, for example. A contact hole is formed in the first insulating film, and a contact plug is formed in the contact hole. The contact plug may be formed of a single-layer film of a metal such as a tungsten, titanium, tantalum, aluminum, copper, silver, or nickel, or an alloy of two or more of these metals, or a laminated film of two or more of these films. Also, a barrier metal may be formed to constitute the contact plug, whereby typically, the gate electrode is connected to a wiring mentioned later. It is preferable that surfaces of the first insulating film and the contact plug are flattened by a suitable method such as a CMP method.

The wiring is formed on the first insulating film and the contact plug connected to the gate electrode. The shape, size, thickness and the like of the wiring can be properly adjusted in accordance with the characteristics of a semiconductor device to be obtained. The shape and size of the wiring can vary. The shape of the wiring may be that of a strip or a pad, for example. The thickness of the wiring may be about 200 to 800 nm.

The wiring may be formed of a conductive single-layer film of a metal such as aluminum, copper, gold, platinum or nickel, or an alloy of two or more of these metals; a refractory metal such as tungsten, tantalum or titanium, or an alloy of two or more of these refractory metals; a polysilicon; a silicide of a refractory metal; a polycide; or the like, or a laminated film of two or more of these films. Typically, the wiring can be formed by forming a conductive film on an entire surface of the first insulating film including the contact plug; forming a resist pattern of a predetermined configuration through a known photolithography technique and etching process; and using the resist pattern as a mask, patterning the conductive film by dry etching. For the dry etching, a plasma may be used.

Also, the antenna pattern of lines/spaces are formed to be connected to the wiring. Preferably, the antenna pattern is formed on the first insulating film in the same manner as the wiring. Preferably, the antenna pattern is formed as part of the wiring. Specifically, the antenna pattern can be integrally formed as part of the wiring so that the antenna pattern and the wiring can be formed at once through the same processes. Namely, the antenna pattern can be formed by forming the conductive film on the entire surface of the first insulating film; forming the resist pattern of a predetermined configuration in which the antenna pattern is added to the pattern of the wiring through the known photolithography technique and etching process; and using the resist pattern as a mask, patterning the conductive film by dry etching. For the dry etching, a plasma may be used. In any case, the antenna pattern can be formed of the same material, to the same thickness or the like as the wiring. In the case where the antenna pattern is formed as part of the wiring, the gate electrode is connected to the wiring via the antenna pattern.

It is preferable that the antenna pattern is partially or entirely formed of lines/spaces. The shape of the antenna pattern can vary and may be that of a swirl, a swastika or a comb, for example. Among them, the shape of a comb is preferable. The rule of lines/spaces can be properly adjusted in accordance with the size of a transistor, the size of a wiring, the size of an antenna pattern or the like which constitute a semiconductor device, and is suitably about 200 to 1000 nm/about 200 to 1000 nm, for example. The antenna pattern is suitably formed such that the surface area thereof is about 2 to 10 times, preferably about 2 to 5 times, and more preferably about 3 times to the entire surface area of the wiring itself. In a different aspect, the antenna pattern is suitably formed such that the surface area thereof is about 1000 times or less the surface area of the gate insulating film directly below the gate electrode to which the wiring is connected.

Incidentally, after the wire and antenna pattern are formed, the resist pattern used as a patterning mask may be generally removed, for example by a plasma ashing and the like.

The second insulating film is typically a film serving as an interlayer dielectric film, as is the first insulating film, and may be made of the same material as the first insulating film. Among the examples, a silicon oxide film or the like is preferable. The second insulating film can be formed in the same manner as the first insulating film, but preferably it is formed by a method utilizing plasma. Specifically, examples of this method are the plasma CVD method, the HDP CVD method and the like method. If one of these methods is used to form the second insulating film, it is preferable that the method is used while substrate bias is applied or that a sputtering method in which substrate bias is applied is used in combination.

The second insulating film may have a contact hole, contact plug and the like in the same manner as the first insulating film. Preferably, the surfaces of the contact hole, contact plug and the like are flattened.

The semiconductor device of the present invention may have a multi-level interconnection structure in which wirings/insulating films are repeatedly formed.

The semiconductor device and the manufacturing method thereof in accordance with the present invention will now be explained in detail based on a preferred embodiment shown in the drawings. It should be understood that the present invention is not limited to the embodiment.

Figure 2E:
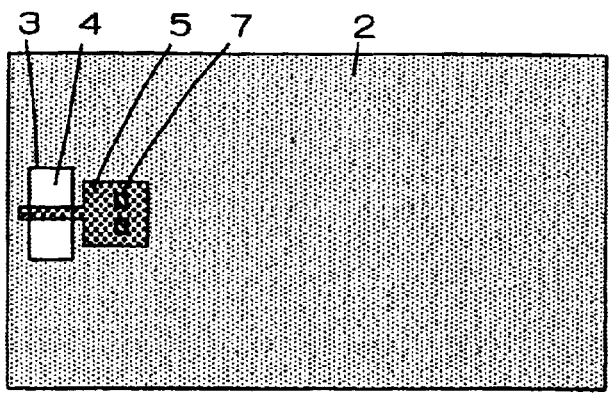
FIGS. 2(e) to (h) are schematic plan views of the essential part for showing processes of the method for manufacturing the semiconductor device in accordance with the present invention.
Figure 2F:
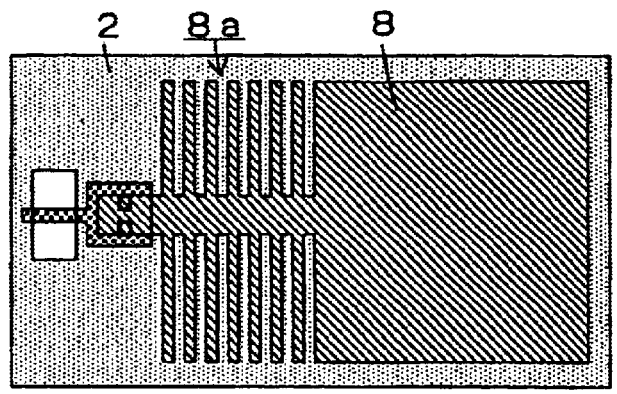
Figure 2G:
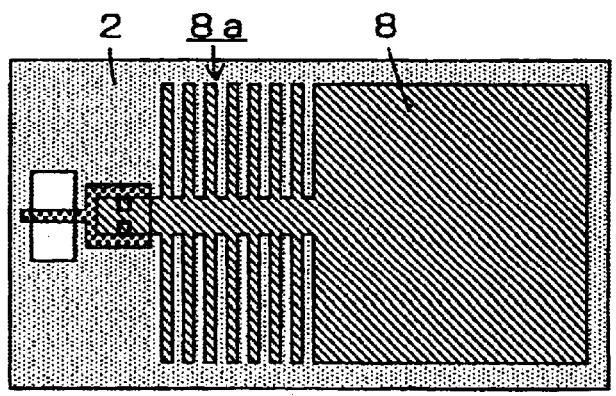
Figure 2H:
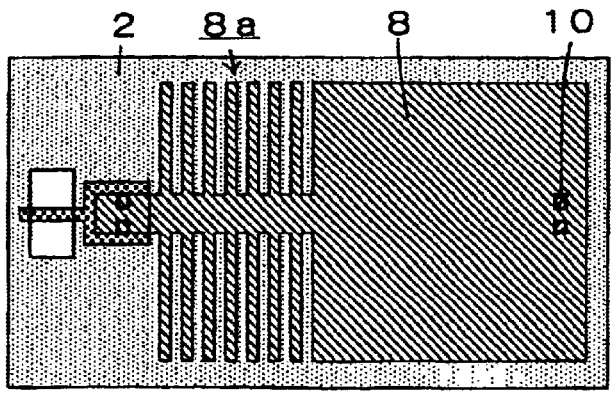
Figure 4E:
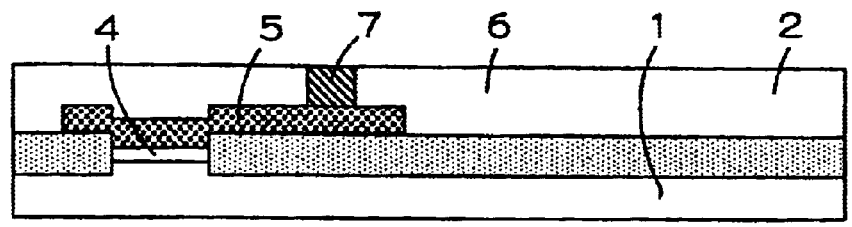
FIGS. 4(e) to (h) are schematic cross-sectional views of the essential part for showing processes the method for manufacturing the semiconductor device in accordance with the present invention.
Figure 4F:
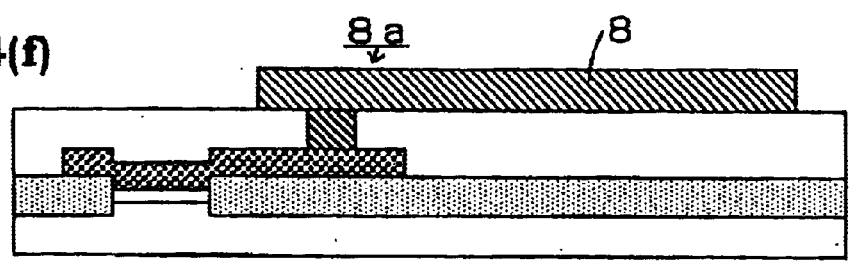
Figure 4G:
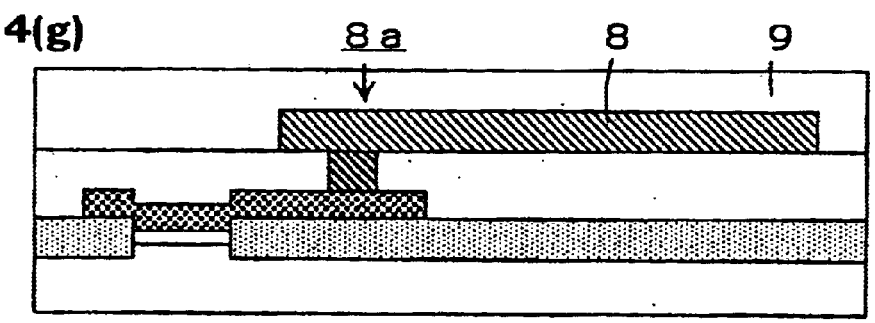
Figure 4H:
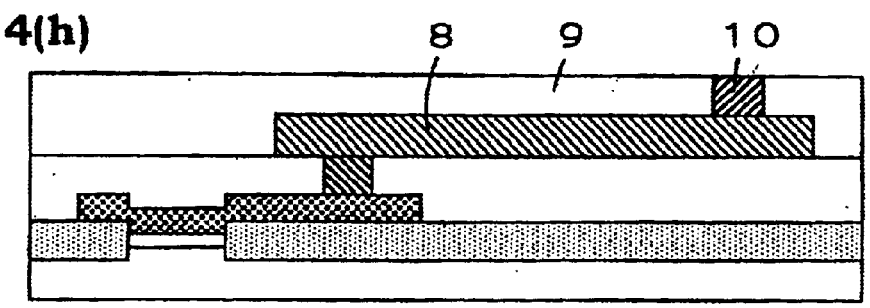
Figure 5A:
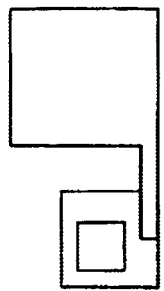
FIGS. 5(a) to (f) are schematic plan diagrams of a wiring and an antenna pattern of lines/spaces for showing the relationship between antenna ratio and yield in accordance with the semiconductor device of the present invention.
Figure 5D:
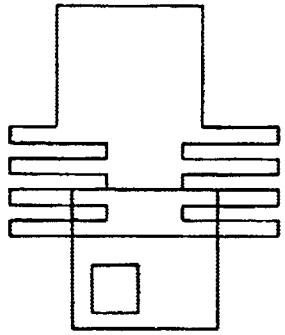
Figure 5B:
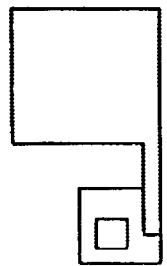
Figure 5E:
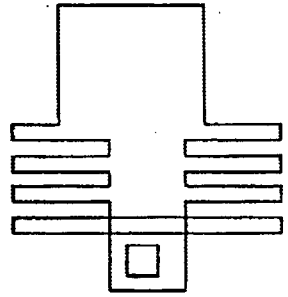
Figure 5C:
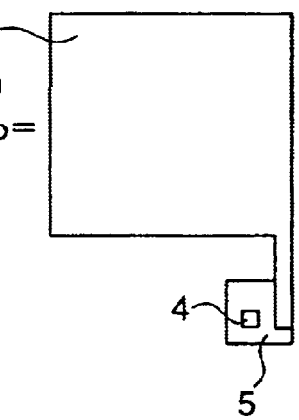
Figure 5F:
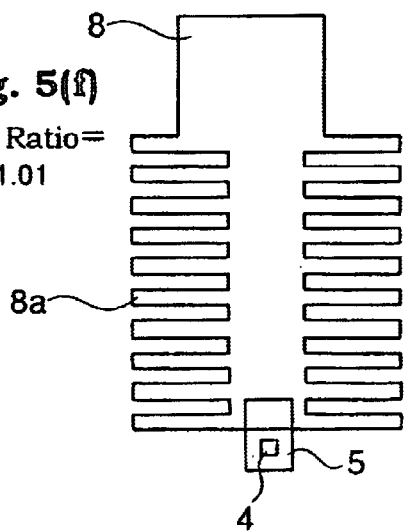

In the semiconductor device of the present invention, an active region 3 is defined by a field oxide film 2 for device isolation on a surface of a semiconductor substrate 1, as shown in FIGS. 2(h) and 4(h). Further, a gate electrode 5 is formed above the semiconductor substrate 1 with a gate oxide film 4 interposed therebetween. A first insulating film 6 is formed as an interlayer dielectric film on a region in which the gate electrode 5 and the field oxide film 2 are formed. A contact hole reaching a surface of the gate electrode 5 is formed in the first insulating film 6, and a tungsten film is buried in the contact hole to form a contact 7. A first wiring 8 is formed on a surface of the first insulating film 6 including a surface of the contact 7. Also, an antenna pattern 8a of lines/spaces is formed at part of the first wiring 8 because the first wiring 8 is of a large pattern like pad. A second insulating film 9 is formed by, for example, the HDP CVD method in which substrate bias is applied, on a region in which the first dielectric film 6 and the first wiring 8 are formed. A via hole reaching a surface of the first wiring 8 is formed in the second insulating film 9, and a tungsten film is buried in the via hole to form a via contact 10. Second and third wirings (not illustrated) are formed in the same manner, whereby forming a multi-level interconnection.

This semiconductor device can be formed in the following manner.

Figure 3A:
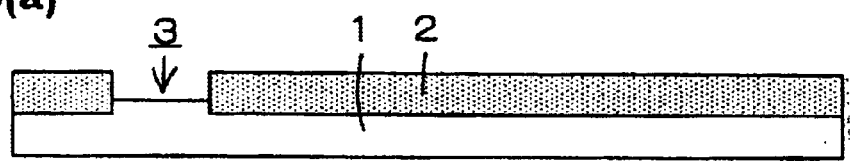
FIGS. 3(a) to (d) are schematic cross-sectional views of the essential part for showing processes of the method for manufacturing the semiconductor device in accordance with the present invention.

First, the field oxide film 2 for device isolation is formed into a predetermined shape and to a thickness of about 350 nm on the semiconductor substrate 1 by a known method, as shown in FIGS. 1(a) and 3(a). Thus, the active region 3 for a transistor is defined at a region not having the field oxide film 2.

Figure 1B:
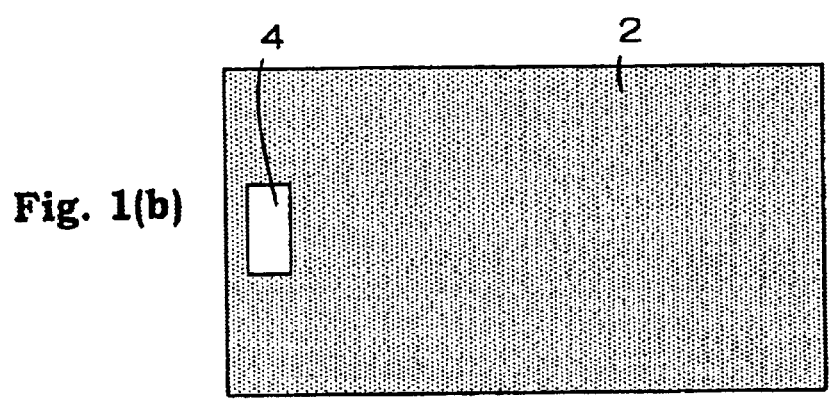
Figure 3B:
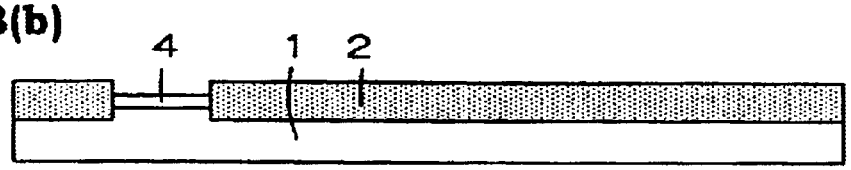

Next, an entire surface of the semiconductor substrate 1 is oxidized to form the gate oxide film 4 of a thickness of about 2 to 10 nm on a surface of the active region 3 on the semiconductor substrate 1, as shown in FIGS. 1(b) and 3(b).

Figure 1C:
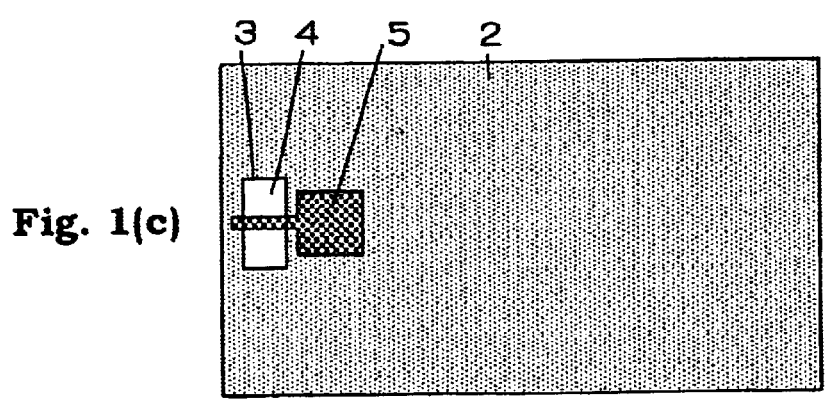
Figure 3C:
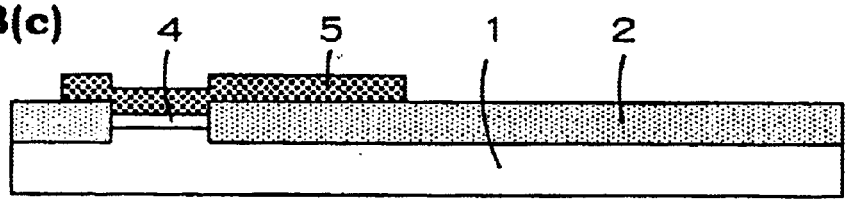

Then, a polysilicon film is formed to a thickness of about 150 nm on the field oxide film 2 and the gate oxide film 4. Using as a mask a photoresist pattern (not illustrated) formed into a predetermined configuration through the typical photolithography technique, the polysilicon film is anisotropically etched to form the gate electrode 5, as shown in FIGS. 1(c) and 3(c).

Figure 1D:
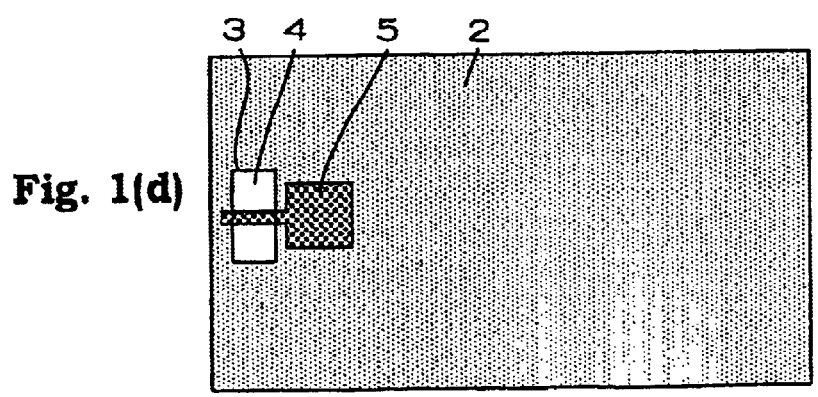
Figure 3D:
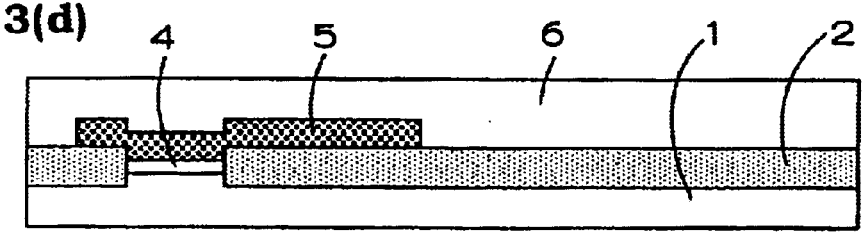

Subsequently, as the first insulating film 6 serving as an interlayer dielectric film, a BPSG is formed to a thickness of 1000 nm on the resulting semiconductor substrate 1, as shown in FIGS. 1(d) and 3(d). If necessary, a surface of the first insulating film 6 may be flattened by a chemical mechanical polishing (CMP).

Thereafter, using as a mask a photoresist pattern (not illustrated) formed into a predetermined configuration by the typical photolithography technique, the contact hole reaching the gate electrode 5 is formed in the first insulating film 6. A tungsten film is formed on an entire surface of the first insulating film 6 including the contact hole by a CVD method. An entire surface of the tungsten film is etched back to be flattened, and the tungsten film is buried in the contact hole to form the contact 7. Here, the CMP method may be used in place of etch back.

Next, an AlCu film of a thickness of about 500 nm is formed as a first wiring on the entire surface of the first insulating film 6 including the contact 7 by the sputtering method. Using as a mask a photoresist pattern (not illustrated) formed into a predetermined configuration by the typical photolithography technique, the AlCu film is anisotropiccally etched utilizing a plasma to form the first wiring 8 and an antenna pattern 8a of lines/spaces, as shown in FIGS. 2(f) and 4(f).

After the resist pattern is removed by a plasma ashing, a silicon oxide film of a thickness of about 700 nm is formed as a second insulating film 9 on an entire surface of the resulting semiconductor substrate, as shown in FIGS. 2(g) and 4(g). The second insulating film 9 in this case is formed by a plasma CVD method used in combination with Ar sputtering in which substrate bias is applied (Ar=50 sccm, 400 W). Alternatively, the second insulating film 9 may be formed by the HDP CVD method in which substrate bias is applied (Ar/SiH$_4$/O$_2$=125/70/125 sccm, 3500 W). If necessary, a surface of the second insulating film 9 may be flattened by the CMP.

Thereafter, using as a mask a photoresist pattern (not illustrated) formed into a predetermined configuration by the typical photolithography technique, the via hole is pierced to reach the first wiring 8, as shown in FIGS. 2(h) and 4(h). Next, in the same manner as above, the tungsten film is buried in the via hole to form the via contact 10.

The same processes are repeated hereinafter, thereby forming the multi-level interconnection.

Semiconductor devices having the same structure as shown in FIGS. 2(h) and 4(h) except that the configurations of the first wiring 8 and the antenna pattern 8a of lines/spaces were changed were formed and the respective proportion defectives thereof were calculated, as shown in FIGS. 5(a) to (f). Here, the thickness of a gate oxide film is 32 angstrom.

The results are shown in Table 1.

|  | Gate Area ($\mu m^2$) | Antenna Ratio | Proportion Defectives of NMOS (%) | Proportion Defectives of PMOS (%) | Pad Area ($\mu m^2$) |
| --- | --- | --- | --- | --- | --- |
| (a) | 81 | 104.12 | 3.5 | 10.5 | 90 × 90 |
| (b) | 8.41 | 1002.87 | 15 | 36 | 90 × 90 |
| (c) | 2.25 | 2732.7 | 38.5 | 54 | 90 × 280 |

-continued

|  | Gate Area ($\mu m^2$) | Antenna Ratio | Proportion Defectives of NMOS (%) | Proportion Defectives of PMOS (%) | Pad Area ($\mu m^2$) |
|---|---|---|---|---|---|
| (d) | 81 | 343.76 | 0.5 | 1 | 90 × 90 |
| (e) | 8.41 | 3311.5 | 1 | 0 | 90 × 90 |
| (f) | 2.25 | 23741.01 | 0 | 2 | 90 × 90 |

Table 1 shows that addition of the antenna pattern 8a of lines/spaces to the first wiring 8 of a large pattern like pad connected to the gate electrode 1 of the MOS transistor formed on the semiconductor substrate 1 alleviates, regardless of antenna ratio, the plasma damage in the formation of the interlayer dielectric film, which results in remarkable reduction of defects caused by dielectric breakdown of a gate electrode or the like.

According to the present invention, the antenna pattern of lines/spaces is considered to allow charges captured in the wiring during a process to be discharged into space, making it possible to reduce the plasma damage to the gate insulating film even with a semiconductor device having a multi-level interconnection, so that a semiconductor device with high reliability can be obtained.

Especially in the case where the shape of the antenna pattern of lines/spaces is that of a comb, it is considered that charges captured in the wiring can be effectively discharged, thereby allowing the plasma damage to be reduced to a further extent.

Further, because the antenna pattern of lines/spaces is made of the same material as the wiring and formed as part of the wiring, a semiconductor device with higher reliability can be obtained which is inexpensive due to that the manufacturing cost is not increased by the complication of manufacturing processes and whose plasma damage to the gate insulating film is reduced.

Also, according to the present invention, the second insulating film is formed on the wiring and the antenna pattern of lines/spaces by the plasma CVD method used in combination with the Ar sputtering in which substrate bias is applied, or the HDP CVD method used while substrate bias is applied. This allows an interval between the wirings to be filled with the insulating film such that there is no void, making it possible to form an interlayer dielectric film with high reliability, resulting in a semiconductor with improved reliability.

Further, for forming the wiring and the antenna pattern of lines/spaces in the same processes, the antenna pattern need not be formed separately from the wiring. This makes it possible to manufacture an LSI and the like which is improved in yield and reliability by an inexpensive and simple method while suppressing the increase in manufacturing costs.

What is claimed is:

1. A semiconductor device comprising:
    a MOS transistor having a gate electrode formed on a semiconductor substrate,
    a gate wiring electrically connected to the gate electrode with a first insulating film being provided at least partially therebetween,
    an antenna pattern for reducing a plasma damage in the form of lines/spaces, wherein said antenna pattern is an integral part of the gate wiring and is thus part of the gate wiring and formed of the same material as the gate wiring, and
    a second insulating film formed on the gate wiring and the antenna pattern.

2. A semiconductor device of claim 1, wherein the shape of the antenna pattern is that of a comb.

3. A semiconductor device of claim 1, wherein the wiring and antenna pattern is formed by a plasma etching.

4. A semiconductor device of claim 1, wherein the antenna pattern is formed such that the surface area thereof is about 2 to 10 times the entire surface area of the wiring itself.

5. The semiconductor device of claim 1, wherein the second insulating film is formed by a plasma CVD method.

6. The semiconductor device of claim 5, wherein the plasma CVD method is used in combination with Ar sputtering or a HDP plasma CVD technique, while applying a bias voltage to the semiconductor substrate.

7. A semiconductor device comprising:
    a MOS transistor having a gate electrode formed on a semiconductor substrate,
    a gate wiring connected to the gate electrode with a first insulating film being provided therebetween,
    an antenna pattern, which is an integral part of the gate wiring connected to the gate electrode, for reducing a plasma damage, said antenna pattering being in the form of lines/spaces,
    a second insulating film formed on the gate wiring and the antenna pattern, and
    wherein the antenna pattern is formed such that the surface area thereof is about 2 to 10 times the entire surface area of the wiring itself.

* * * * *

UNITED STATES PATENT AND TRADEMARK OFFICE
CERTIFICATE OF CORRECTION

PATENT NO. : 6,828,604 B2
DATED : December 7, 2004
INVENTOR(S) : Inoue, Y.

It is certified that error appears in the above-identified patent and that said Letters Patent is hereby corrected as shown below:

Title page,
Item [30], Foreign Application Priority Data, should read as follows:
-- May 8, 2001 (JP)     2001-137475 --

Signed and Sealed this

Tenth Day of May, 2005

JON W. DUDAS
*Director of the United States Patent and Trademark Office*